US010845417B2

(12) United States Patent
 Nakamura et al.

(10) Patent No.: US 10,845,417 B2
(45) Date of Patent: Nov. 24, 2020

(54) BATTERY STATE ESTIMATION DEVICE, BATTERY CONTROL DEVICE, BATTERY SYSTEM, BATTERY STATE ESTIMATION METHOD

(71) Applicant: HITACHI AUTOMOTIVE SYSTEMS, LTD., Hitachinaka-shi, Ibaraki (JP)

(72) Inventors: Yohei Nakamura, Hitachinaka (JP); Keiichiro Ohkawa, Hitachinaka (JP)

(73) Assignee: VEHICLE ENERGY JAPAN, INC., Hitachinaka (JP)

( * ) Notice: Subject to any disclaimer, the term of this patent is extended or adjusted under 35 U.S.C. 154(b) by 220 days.

(21) Appl. No.: 16/064,091

(22) PCT Filed: Jan. 10, 2017

(86) PCT No.: PCT/JP2017/000371
§ 371 (c)(1),
(2) Date: Jun. 20, 2018

(87) PCT Pub. No.: WO2017/130673
PCT Pub. Date: Aug. 3, 2017

(65) Prior Publication Data
US 2019/0004115 A1  Jan. 3, 2019

(30) Foreign Application Priority Data
Jan. 29, 2016 (JP) .................. 2016-015026

(51) Int. Cl.
*G01R 31/3828* (2019.01)
*H01M 10/48* (2006.01)
(Continued)

(52) U.S. Cl.
CPC ....... *G01R 31/3828* (2019.01); *G01R 31/392* (2019.01); *H01M 10/48* (2013.01);
(Continued)

(58) Field of Classification Search
USPC .................................. 324/426–435
See application file for complete search history.

(56) References Cited

U.S. PATENT DOCUMENTS 9,537,325 B2  1/2017 Igarashi et al.
9,566,875 B2  2/2017 Kawakita
(Continued)

FOREIGN PATENT DOCUMENTS

CN    102869999 A    1/2013
CN    103630843 A    3/2014
(Continued)

OTHER PUBLICATIONS

International Search Report, PCT/JP2017/000371, dated Apr. 25, 2017, 2 pgs.
(Continued)

*Primary Examiner* — Vincent Q Nguyen
(74) *Attorney, Agent, or Firm* — Volpe Koenig

(57) ABSTRACT

A battery management device includes an SOCv calculation unit that calculates a state of charge using voltage across both ends of a battery, an SOCi calculation unit calculates a state of charge by integrating currents flowing in the battery, and an SOCw calculation unit performs weighted addition of the battery's state of charges calculated by the SOCv and the SOCi calculation unit. An SOCi biased time calculation unit calculates an SOCi biased time based on one or a plurality of elapsed time from the end of a previous system operation or the end of charging or discharging during the previous system operation to the start of the current system, temperature, degree of degradation, and polarization voltage of the battery. The SOCw increases a weight of the state of charge of the battery calculated by the SOCi calculation while the elapsed time from the activation is within the SOCi biased time.

7 Claims, 11 Drawing Sheets

(51) Int. Cl.
*H02J 7/00* (2006.01)
*G01R 31/392* (2019.01)
*G01R 31/367* (2019.01)

(52) U.S. Cl.
CPC ............. *H01M 10/486* (2013.01); *H02J 7/00* (2013.01); *G01R 31/367* (2019.01)

(56) References Cited

U.S. PATENT DOCUMENTS

| | | | |
|---|---|---|---|
| 2004/0008031 A1* | 1/2004 | Arai | H01M 10/48 324/429 |
| 2005/0237024 A1 | 10/2005 | Hogari et al. | |
| 2009/0001992 A1 | 1/2009 | Tsuchiya | |
| 2014/0055100 A1 | 2/2014 | Igarashi et al. | |
| 2014/0167656 A1 | 6/2014 | Yamada | |
| 2016/0272080 A1* | 9/2016 | Chang | B60L 58/12 |
| 2018/0074129 A1 | 3/2018 | Nakao et al. | |

FOREIGN PATENT DOCUMENTS

| | | |
|---|---|---|
| JP | 2005-315730 A | 11/2005 |
| JP | 2006-038495 A | 2/2006 |
| JP | 2007-178215 A | 7/2007 |
| JP | 2008-145349 A | 6/2008 |
| JP | 2014-044074 A | 3/2014 |
| JP | 2015-040764 A | 3/2015 |
| WO | 2013/031559 A1 | 3/2013 |
| WO | 2016/158396 A1 | 10/2016 |
| WO | 2017/056732 A1 | 4/2017 |

OTHER PUBLICATIONS

Chinese Office Action dated Nov. 27, 2019 for the Chinese Patent Application No. 201780004119.8.

* cited by examiner

BATTERY STATE ESTIMATION DEVICE, BATTERY CONTROL DEVICE, BATTERY SYSTEM, BATTERY STATE ESTIMATION METHOD

TECHNICAL FIELD

The present invention relates to a technique of estimating a state of charge of a battery.

BACKGROUND ART

A state detection device that detects a state of an electric storage means has been used in devices using the electric storage means, such as a lithium ion secondary battery, a nickel metal hydride battery, a lead battery, and an electric double layer capacitor, for example, in battery systems, distributed power storage devices, and electric cars in order to safely and effectively use the electric storage means. Examples of the state of the electric storage means include a state of charge (SOC) indicating how much the electric storage means is being charged or how much the amount of charge that can be discharged remains, a state of health (SOH) indicating how much the electric storage means has been degraded, and the like.

The SOC in battery systems such as mobile devices and electric cars can be detected by integrating a discharge current from a full charge state, and calculating a ratio of the amount of charge (remaining capacity) remaining in the electric storage means relative to the maximum chargeable amount of charge (total capacity). In addition, a current remaining capacity can be also calculated by defining a relationship between a voltage across both ends of a battery (open circuit voltage) and a remaining capacity of the battery, in advance, in a data table or the like, and referring to this data table. Further, it is also possible to obtain the state of charge by combining these methods.

The open circuit voltage of the battery can be obtained by performing measurement when the battery is turned into a stable state after a lapse of time from the stop of charging and discharging of the battery, but it is difficult to directly measure the open circuit voltage because a polarization voltage, generated by charging and discharging, is generated during the operation of the battery system. Therefore, the polarization voltage is estimated based on measured state quantity such as a voltage (closed circuit voltage) during the operation of the battery system, a current flowing in the battery, a temperature of the battery, and the like. A method of calculating the state of charge by obtaining the open circuit voltage by subtracting the polarization voltage thus obtained from the closed circuit voltage is generally used.

This method can be implemented during the operation of the battery system, but the state quantity cannot be measured while the battery system is stopped, and the polarization voltage cannot be estimated. However, the polarization voltage has a characteristic that a lapse of time from several minutes to several hours is required from generation to elimination thereof, and thus, there is a possibility that this polarization voltage has not been eliminated and the battery has not been turned into a stable state when the time from the stop of the battery system to the next activation is short. In this case, it is necessary to obtain the open circuit voltage by using the polarization voltage, but the polarization voltage while the battery system is stopped cannot be estimated as described above. Thus, even a polarization voltage at the next activation cannot be correctly estimated and a correct open circuit voltage cannot be obtained, so that there is a risk that an error may occur in calculation of the state of charge.

The following PTL 1 describes a method of selecting one of a state of charge SOC1 obtained using a battery voltage at the time of activating a battery system, a state of charge SOC2 stored at a previous end of the battery system, and a state of charge SOC3 calculated using an open circuit voltage estimated based on a battery voltage measured for a predetermined time after the previous end of the battery system, as an initial state of charge at the time of activating the battery system, based on a time for which the battery system is stopped.

CITATION LIST

Patent Literature

PTL 1: JP 2008-145349 A

SUMMARY OF INVENTION

Technical Problem

The technique described in the above PTL 1 is achieved by assuming a method of obtaining the state of charge of a battery during the operation of the battery system by integrating charge and discharge currents of the battery, and is specialized in correctly obtaining the initial state of charge at a start of the battery system activation which is an initial value of the integration.

However, there is a risk that accuracy of the state of charge may deteriorate due to an error of a current sensor, an error in battery capacity, or the like in the method of obtaining the state of charge by integrating the charge and discharge currents of the battery. In order to prevent such a risk, it is desirable to improve the accuracy of the state of charge by a complex method combined with the method of calculating the state of charge based on the voltage across both ends of the battery and the polarization voltage as described above. However, calculation cannot be performed only with the initial state of charge at the start of the battery system activation so that the correct polarization voltage cannot be estimated after starting activation in the method of calculating the state of charge based on the voltage across both ends of the battery and the polarization voltage and the complex method using the same, and there is a problem that the calculation accuracy of the state of charge deteriorates.

Solution to Problem

A battery management device includes: an SOCv calculation unit that calculates a state of charge using a voltage across both ends of a battery; an SOCi calculation unit that calculates a state of charge by integrating currents flowing in the battery; an SOCw calculation unit that performs weighted addition of the state of charge of the battery calculated by the SOCv calculation unit and the state of charge of the battery calculated by the SOCi calculation unit; and an SOCi biased time calculation unit that calculates an SOCi biased time based on one or a plurality of an elapsed time from an end of a previous system operation of the battery or an end of charging or discharging during the previous system operation to a start of current system activation, a temperature of the battery, a degree of degradation of the battery, and a polarization voltage of the battery. The SOCw calculation unit increases a weight of the state of charge of the battery calculated by the SOCi calculation unit while an elapsed time from the start of the current system activation is within the SOCi biased time.

Advantageous Effects of Invention

According to the battery management device of the present invention, it is possible to obtain favorable calculation accuracy of a state of charge SOCw of a battery not only at the start of system activation but also after the start of system activation even when a time from a stop of a battery system to next activation is short and the battery is not in a stable state by increasing the weight of SOCi until influence of polarization is eliminated after a start of next system activation in a method of calculating a state of charge of the battery using SOCw obtained by weighted addition of SOCv to calculate the state of charge using the voltage across both ends of the battery and SOCi to calculate the state of charge by integrating the currents.

DESCRIPTION OF EMBODIMENTS

Hereinafter, embodiments for carrying out the present invention will be described with reference to the drawings.

First Embodiment

First Embodiment: System Configuration

Figure 1:
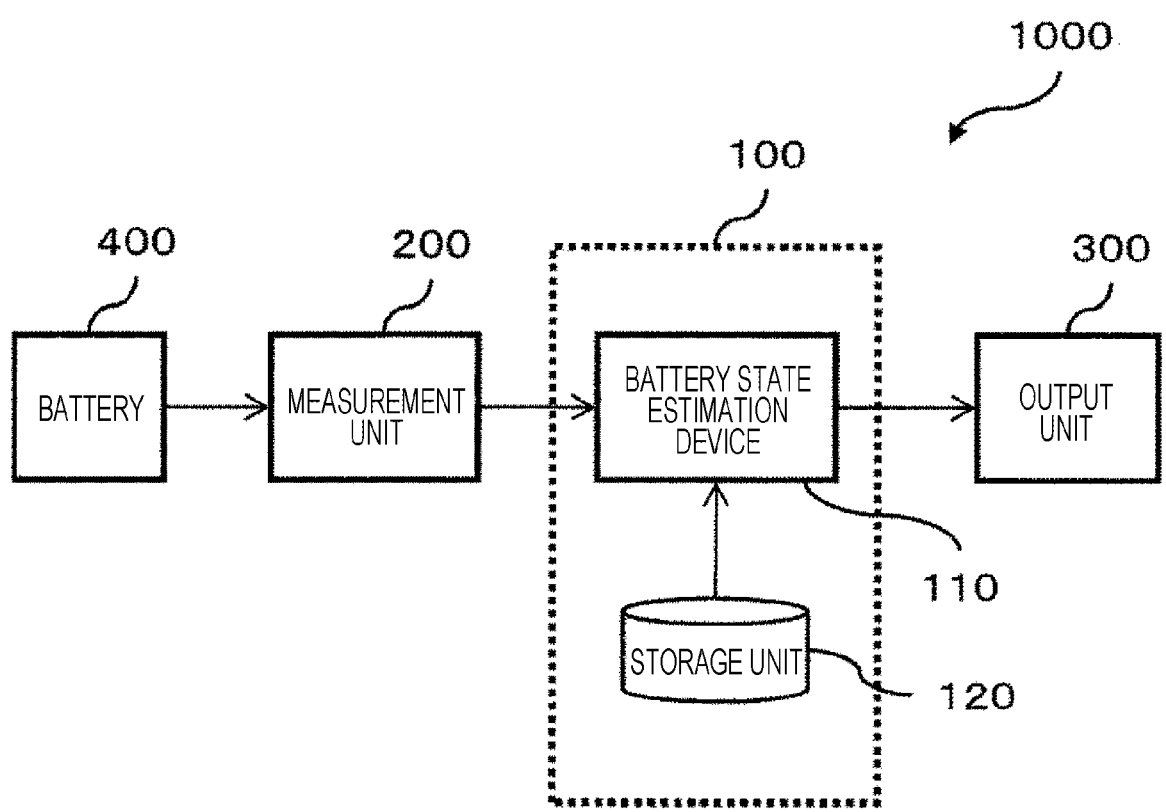
FIG. 1 is a block diagram illustrating a configuration of a battery system 1000 according to a first embodiment.

FIG. 1 is a block diagram illustrating a configuration of a battery system 1000 according to a first embodiment of the present invention. The battery system 1000 is a system that supplies electric charges stored in a battery 400 as power to an external device, and includes a battery control device 100, a measurement unit 200, and an output unit 300. Examples of an object to which the battery system 1000 supplies power include an electric car, a hybrid car, a train, and the like.

The battery 400 is, for example, a rechargeable battery such as a lithium ion secondary battery. In addition, the present invention can be also applied to a device having a power storage function such as a nickel metal hydride battery, a lead battery, an electric double layer capacitor, and the like. The battery 400 may be configured using a single battery cell or a module structure in which a plurality of single cells are combined.

The measurement unit 200 is a functional unit that measures physical characteristics of the battery 400, for example, a voltage V across both ends of the battery 400, a current I flowing in the battery 400, a temperature T of the battery 400, an internal resistance R of the battery 400, and the like, and is configured using a sensor that measures each value, a necessary electric circuit, and the like. The internal resistance R may be measured indirectly by a battery state estimation device 110 to be described later using other measurement parameters. The first embodiment is premised on the latter. That is, the battery state estimation device 110 itself corresponds to a "resistance measurement unit" in the first embodiment. The output unit 300 is a functional unit that outputs an output of the battery control device 100 to an external device (for example, a host device such as a vehicle control device of an electric car).

The battery control device 100 is a device that controls an operation of the battery 400, and includes the battery state estimation device 110 and a storage unit 120.

The battery state estimation device 110 estimates an SOC of the battery 400 based on the respective measurement values (the voltage V across both ends, the battery current I, and the battery temperature T) measured by the measurement unit 200, characteristic information of the battery 400 stored in the storage unit 120 (a polarization voltage Vp of the battery 400, the internal resistance R, and the like, details thereof will be described later). Details of a calculation method will be described later.

The storage unit 120 stores the characteristic information of the battery 400 that can be known in advance, such as the internal resistance R, the polarization voltage Vp, a charging efficiency, an allowable current, and the total capacity of the battery 400. This information may be stored by individually storing a value for each operation of charging and discharging, by individually storing a value for each state of the battery 400, such as a state of charge and a temperature, or by storing one value common to all states of the battery 400. Further, the storage unit 120 stores a correspondence table to be described later with reference to FIG. 6.

The battery control device 100 and the battery state estimation device 110 may be configured using hardware such as a circuit device that realizes functions thereof, or can be configured as software in which the functions thereof are mounted is executed by a computing device such as a central processing unit (CPU). In the latter case, the software can be stored in the storage unit 120, for example.

The storage unit 120 is configured using a storage device such as a flash memory, an electrically erasable programmable read only memory (EEPROM), and a magnetic disk. The storage unit 120 may be provided outside the battery state estimation device 110 or may be realized as a memory device provided inside the battery state estimation device 110. The storage unit 120 may be detachably provided.

When the storage unit 120 is detachably provided, it is possible to easily change the characteristic information and software by replacing the storage unit 120. In addition, when a plurality of the storage units 120 are provided and the characteristic information and software are distributed and stored in the replaceable storage units 120, it is possible to update the characteristic information and software for each small unit.

Figure 2:
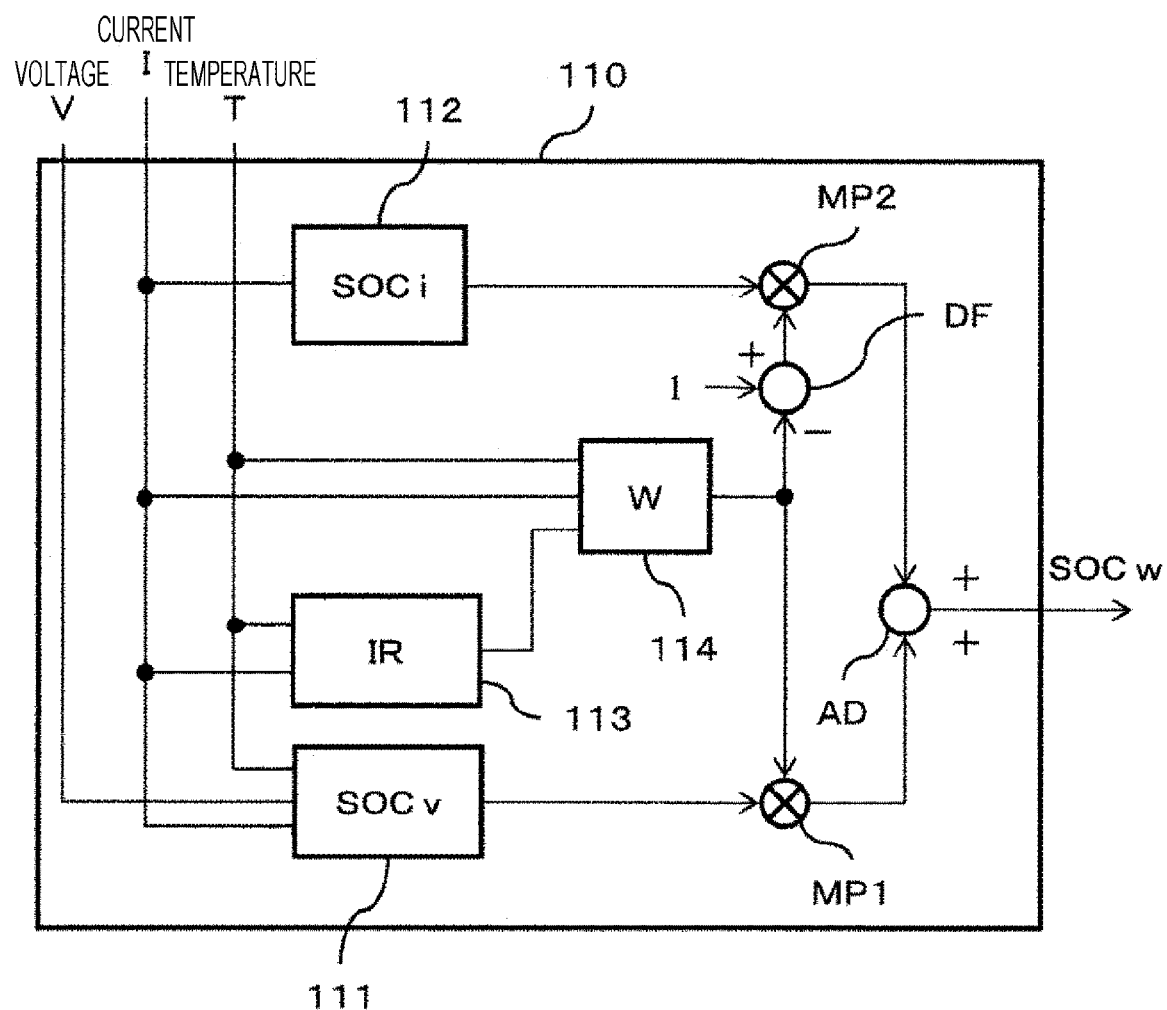
FIG. 2 is a functional block diagram illustrating details of a conventional battery state estimation device 110.

FIG. 2 is a functional block diagram illustrating details of the battery state estimation device 110. The battery state estimation device 110 includes an SOCv calculation unit 111, an SOCi calculation unit 112, an IR calculation unit 113, and a weight calculation unit 114, and outputs a state of charge SOCw that is a result of estimating a state of charge of the battery 400. Other calculators will be described later.

The SOCv calculation unit 111 calculates an SOC of the battery 400 using the voltage V across both ends of the battery 400 measured by the measurement unit 200. Hereinafter, this SOC will be referred to as SOCv. The SOCi calculation unit 112 calculates an SOC of the battery 400 by integrating the battery currents I of the battery 400 measured by the measurement unit 200. Hereinafter, this SOC will be referred to as SOCi. Methods of calculating SOCv and SOCi will be described later. The IR calculation unit 113 multiplies the battery current I by the internal resistance R. A method of obtaining the internal resistance R will be described later. The weight calculation unit 114 calculates a weight W for weighting addition of SOCv and SOCi. A method of calculating W will be described later.

A multiplier MP1 multiplies SOCv and the weight W to obtain W×SOCv. A subtractor DF obtains (1−W). A multiplier MP2 multiplies SOCi and (1−W) to obtain (1−W)×SOCi. An adder AD adds these multiplied values to obtain SOCw. That is, SOCw is expressed by the following Formula 1.

$$SOCw = W \times SOCv + (1-W) \times SOCi \quad \text{Formula 1}$$

First Embodiment: Operation of SOCv Operation Unit 111

Figure 3:
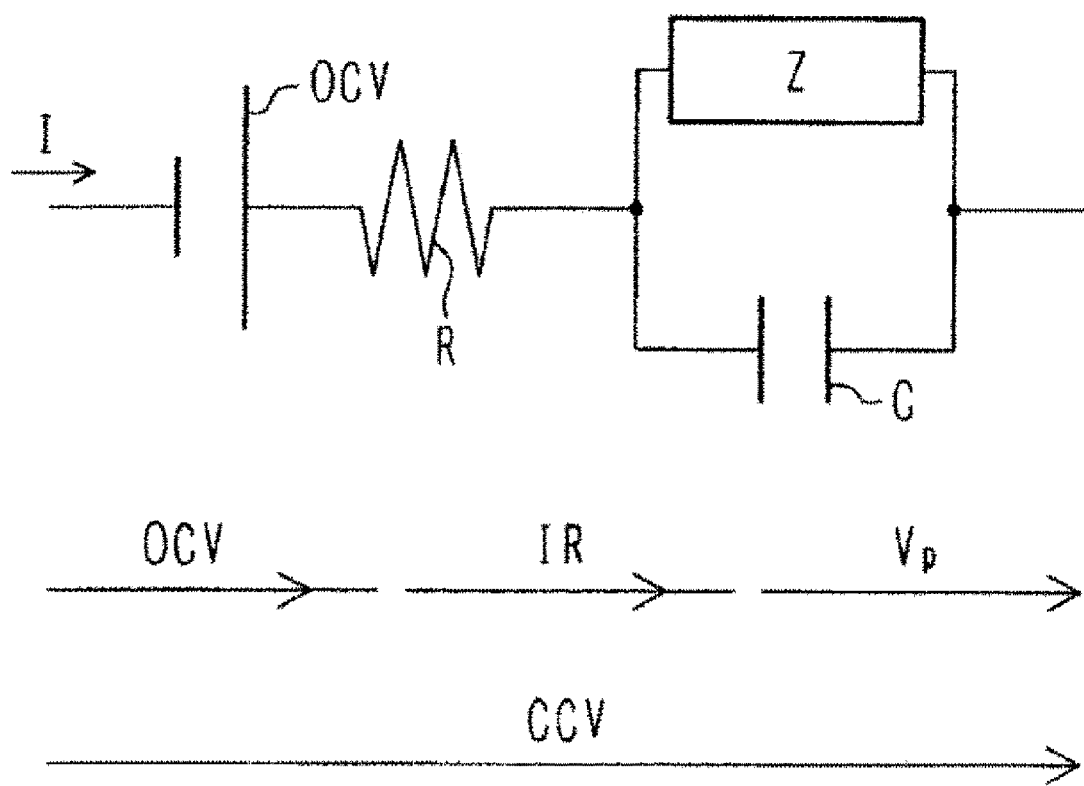
FIG. 3 is an equivalent circuit diagram of a battery 400.

FIG. 3 is an equivalent circuit diagram of the battery 400. The battery 400 can be expressed by series connection of a parallel connection pair of an impedance Z and a capacitance component C, the internal resistance R, and an open circuit voltage OCV. When the battery current I is applied to the battery 400, a voltage across terminals (closed circuit voltage: CCV) of the battery 400 is expressed by the following Formula 2. Here, Vp is the polarization voltage, which corresponds to a voltage across both ends of the parallel connection pair of the impedance Z and the capacitance component C.

$$CCV = OCV + I \cdot R + Vp \quad \text{Formula 2}$$

The open circuit voltage OCV is used to obtain the SOC as will be described later, but the open circuit voltage OCV cannot be directly measured during charging or discharging of the battery 400. Thus, the SOCv calculation unit 111 obtains the open circuit voltage OCV by subtracting an IR drop and the polarization voltage Vp from the closed circuit voltage CCV according to the following Formula 3.

$$OCV = CCV - IR - Vp \quad \text{Formula 3}$$

The internal resistance R and the polarization voltage Vp can be stored in the storage unit 120 in advance as the characteristic information. Since the internal resistance R and the polarization voltage Vp differ depending on the state of charge, the temperature, and the like of the battery 400, individual values for each combination thereof can be stored in the storage unit 120. The characteristic information defining a correspondence relationship between the internal resistance R and the battery temperature T corresponds to a "resistance table" in the first embodiment.

Figure 4:
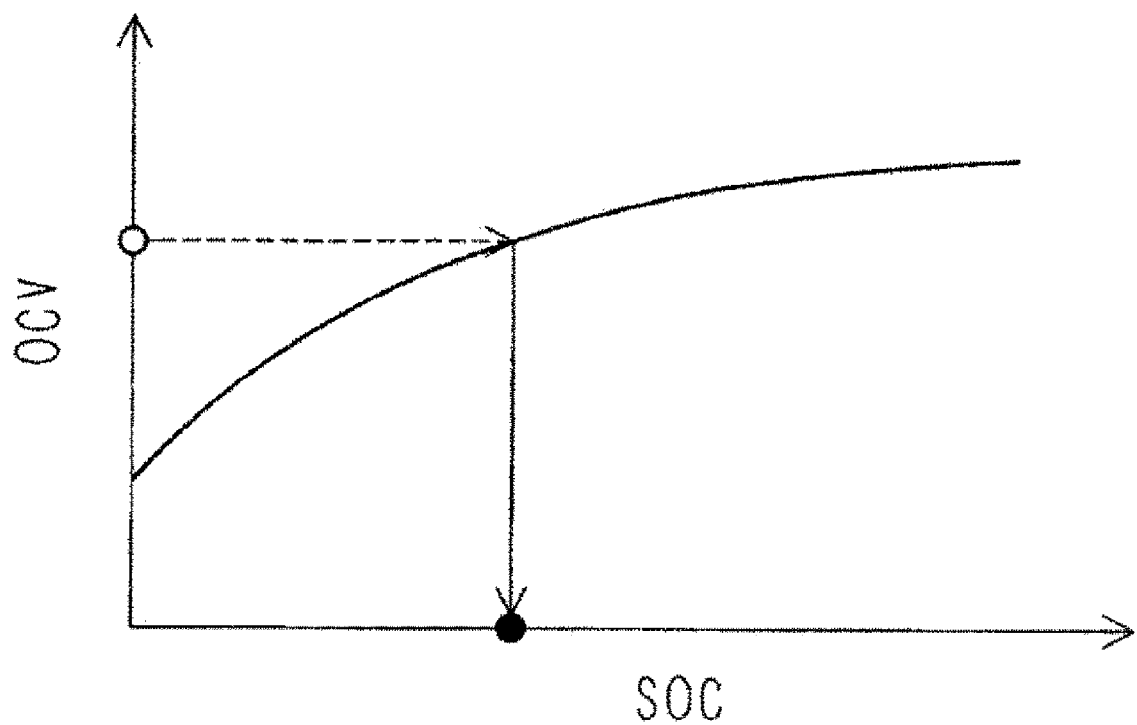
FIG. 4 is a diagram illustrating a relationship between an open circuit voltage OCV and an SOC of the battery 400.

FIG. 4 is a diagram illustrating a relationship between the open circuit voltage OCV and the SOC of the battery 400. Since this correspondence relationship is determined depending on the characteristics of the battery 400, data defining the correspondence relationship can be stored in the storage unit 120 in advance. This data corresponds to an "SOC table" in the first embodiment. The SOCv calculation unit 111 can calculate SOCv of the battery 400 by calculating the open circuit voltage OCV using the above-described Formula 3 and referring to the SOC table using the calculated open circuit voltage OCV as a key.

First Embodiment: Operation of SOCi Operation Unit 112

The SOCi calculation unit 112 calculates SOCi of the battery 400 by integrating the battery currents I charged to and discharged from the battery 400 according to the following Formula 4. Here, Q max is a full charge capacity of the battery 400 and can be stored in the storage unit 120 in advance. Here, SOCold is a value of SOCw calculated in a previous calculation period by Formula 1.

$$SOCi = SOCold + 100 \times \int I/Q\,max \quad \text{Formula 4}$$

First Embodiment: Operation of Weight Calculation Unit 114

Figure 5:
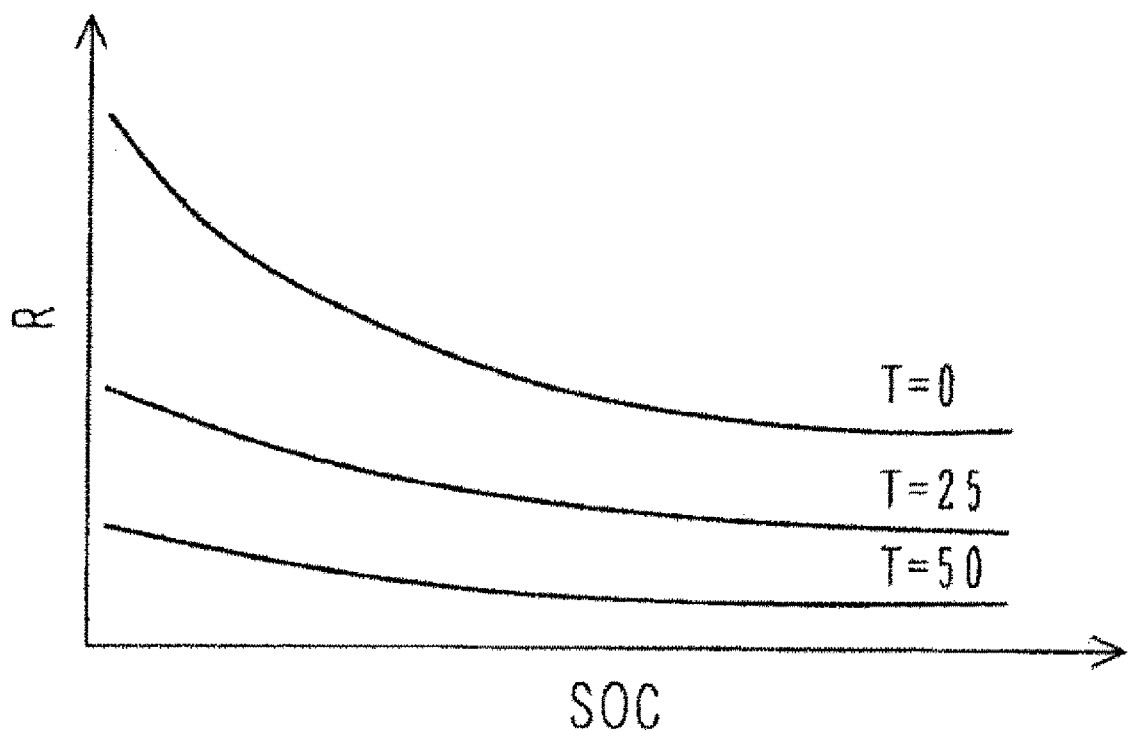
FIG. 5 is a diagram illustrating how an internal resistance R of the battery 400 changes depending on the SOC and a battery temperature T.

FIG. 5 is a diagram illustrating how the internal resistance R of the battery 400 changes depending on the battery temperature T. As illustrated in FIG. 5, the battery 400 generally has the high internal resistance R in a low SOC state and a large value of the internal resistance R in a low temperature state. Therefore, at this time, it is considered that it is desirable to use SOCi instead of SOCv which is easily affected by an error of the internal resistance R. In addition, it is considered that it is desirable to use SOCv instead of SOCi since SOCi is affected by a slight measurement error of a current sensor when the battery current I is small.

Based on the above assumptions, the weight calculation unit 114 obtains the weight W so as to calculate SOCw mainly using SOCv when the battery current I is small and to calculate SOCw mainly using SOCi when the battery current I is large. Similarly, the weight calculation unit 114 obtains the weight W so as to calculate SOCw mainly using SOCv when the internal resistance R is low and to calculate SOCw mainly using SOCi when the internal resistance R is high. That is, the weight W for SOCv is set to be larger as the battery current I is smaller, and the weight W for SOCv is set to be larger as the internal resistance R is lower. For example, the weight W can be calculated according to the following Formula 5.

$$W = 1/(1 + R \cdot |I|) \quad \text{Formula 5}$$

According to the above-described method, W decreases when the internal resistance R is high and when an absolute value of the battery current I is large, so that the weight of SOCi becomes large, and W increases when the internal resistance R is low and when the absolute value of the battery current I is small, so that the weight of SOCv increases.

First Embodiment: Determination of Weight W

In principle, the weight calculation unit 114 obtains the weight W as described above, but the inventor of the present application has found out a method of appropriately obtaining the weight W after a start of current system activation in a case where influence of polarization of the battery 400 remains because an elapsed time from an end of charging or discharging during a previous system operation to the start of the current system activation is short.

Figure 6:
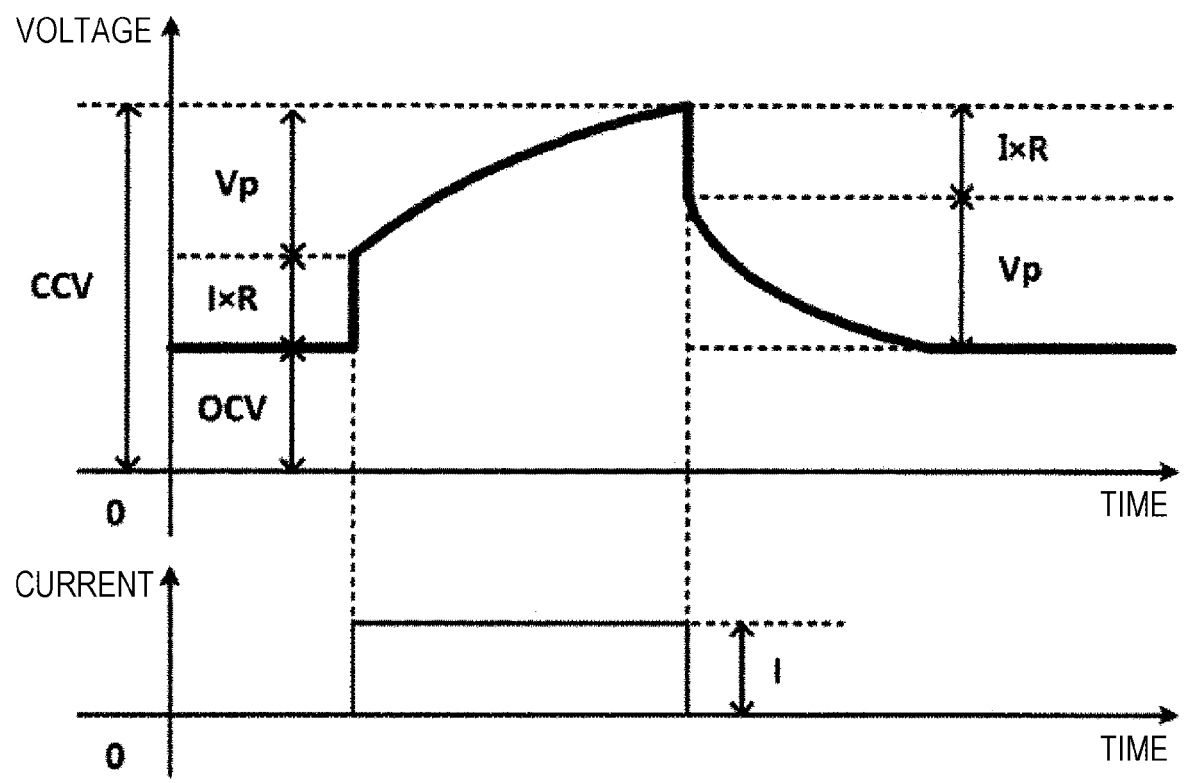
FIG. 6 is a diagram illustrating a polarization voltage Vp that changes with a lapse of time during charging.

The polarization voltage Vp of the battery 400 is characterized by varying depending on the state of charge of the battery 400 and the battery temperature T, and increases with a lapse of time when charging is started, and decreases with a lapse of time when charging is ended and eventually becomes a substantially zero state as illustrated in FIG. 6. The polarization voltage Vp decreases with a lapse of time when discharging is started, and increases with a lapse of time when discharging is ended and eventually becomes a substantially zero state.

The SOCv calculation unit 111 calculates the open circuit voltage OCV in Formula 3 using the polarization voltage Vp and then calculates SOCv. However, the battery state cannot be detected while the system is stopped, and thus, a polarization voltage Vp2 after the start of the current system activation cannot be accurately calculated. As a result, the open circuit voltage OCV becomes an inaccurate value based on Formula 3, and there is a risk that the calculation accuracy of SOCv may deteriorate and the calculation accuracy of SOCw may deteriorate based on Formula 1.

Figure 7:
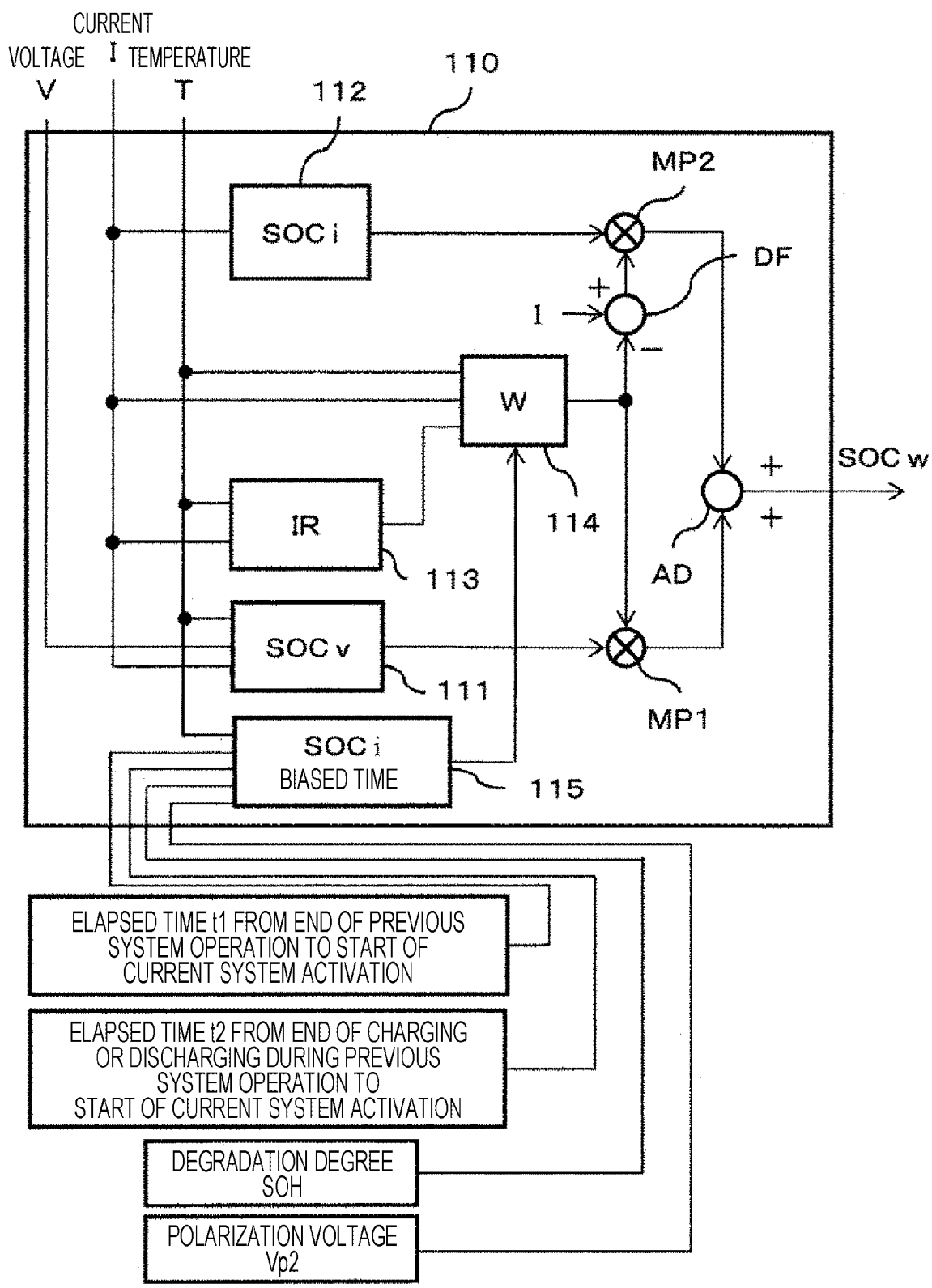
FIG. 7 is a functional block diagram illustrating details of the battery state estimation device 110 changed according to the present invention.

In order to prevent such deterioration of the calculation accuracy of SOCw, Formula 5 of the weight W is changed by adding a correction coefficient Ksoci 115 as in the following Formula 6. In addition, a functional block diagram is illustrated in FIG. 7.

$$W = Ksoci \times 1/(1 + R \cdot |I|) \quad \text{Formula 6}$$

Figure 8:
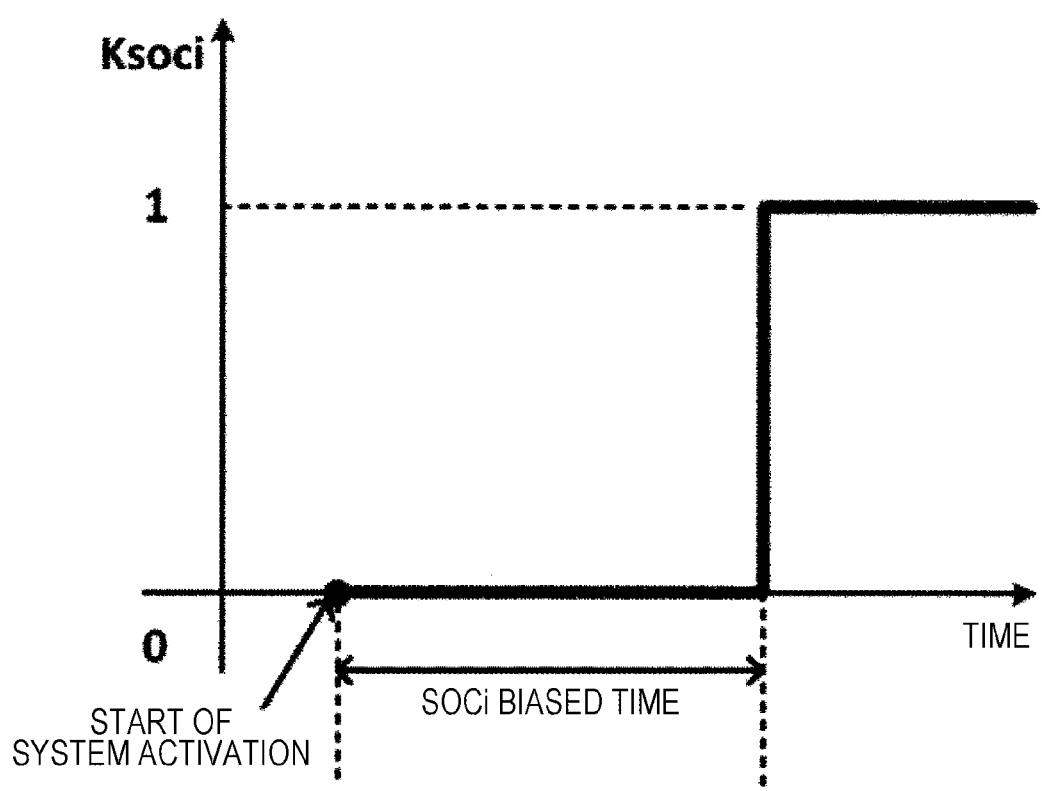
FIG. 8 is a diagram illustrating an example of setting of a correction coefficient Ksoci.

The correction coefficient Ksoci is a coefficient that takes a value between zero and one, and is set to substantially zero after the start of the current system activation and is set to one after the SOCi biased time (to be described later) has elapsed as illustrated in FIG. 8. In this manner, the weight W becomes substantially zero based on Formula 6 after the start of the current system activation, and becomes approximately equivalent to one calculated using SOCi as SOCw≈SOCi based on Formula 1. Since SOCi does not include the polarization voltage Vp2 as apparent from Formula 4, SOCi is not affected even when the influence of polarization of the battery 400 remains. Therefore, since SOCw is calculated using SOCi, instead of SOCv whose calculation accuracy is likely to deteriorate, after the start of the system activation in which the influence of polarization of the battery 400 remains by introducing this correction coefficient Ksoci, it is possible to prevent the deterioration of the calculation accuracy of SOCw. Further, since the correction coefficient Ksoci becomes one after the SOCi biased time has elapsed, the weight W becomes equivalent to the conventional Formula 5. As a result, since the conventional SOCw calculation is applied after the influence of polarization of the battery 400 is eliminated, there is no risk that a behavior or the calculation accuracy of SOCw may change.

In addition, the correction coefficient Ksoci is set to substantially zero after the start of the current system activation in FIG. 8, but is not necessarily set to be substantially zero as long as a setting value that makes the weight of SOCi large such that the calculation accuracy of SOCw does not deteriorate is used, or may be a value that changes rather than a fixed value.

First Embodiment: Operation of SOCi Biased Time Calculation Unit 115

The SOCi biased time is desirably calculated based on the degree of influence of polarization of the battery 400 at the start of the current system activation. Therefore, the SOCi biased time is calculated by preparing a function having any or a plurality of parameters of the following parameters (1) to (5) as factors.

(1) Elapsed time t1 from an end of a previous system operation end to a start of current system activation
(2) Elapsed time t2 from an end of charging or discharging during the previous system operation to the start of the current system activation
(3) Battery temperature T
(4) Degradation degree SOH of battery 400
(5) Polarization voltage Vp2 after the start of the current system activation Here, the function may be an expression using the respective parameters or a search scheme using a map or a table.

The elapsed time t1 in (1) may be obtained by a method of measuring a time by providing a time counter in the battery state estimation device 110, a method of receiving an elapsed time information signal from another device connected to the battery state estimation device 110 and using the signal, or a method of combining both the methods.

The elapsed time t2 in (2) may be obtained by a method of detecting an end of charging or discharging by detecting the battery current I and measuring a time by providing a time counter in the battery state estimation device 110 similarly to the elapsed time t1, a method of receiving an elapsed time information signal from another device connected to the battery state estimation device 110 and using the signal, or a method of combining both the methods.

The degradation degree SOH in (4) may be obtained by a method of calculating a degradation degree by providing a degradation degree calculation unit in the battery state estimation device 110, a method of receiving a degradation degree information signal from another device connected to the battery state estimation device 110 and using the signal, or a method of combining both the methods.

As described above, since the battery state cannot be detected while the system is stopped, the polarization voltage Vp2 after the start of the current system activation in (5) cannot be accurately calculated. Therefore, a method of calculating the polarization voltage Vp2 by providing a polarization voltage estimation calculation unit, which estimates the polarization voltage Vp2 based on the elapsed time t1 and the polarization voltage Vp during system operation is conceivable as an example. As another example, a method of obtaining the polarization voltage Vp2 after the start of the current system activation by repeating a process of automatically and intermittently activating the battery state estimation device 110 to detect a battery state while the system is stopped, calculating a polarization voltage, and ending the process by saving the calculated polarization voltage in the storage unit 120 is conceivable. Alternatively, a method of combining both the methods may be used.

First Embodiment: Summary

As described above, the battery state estimation device 110 according to the first embodiment calculates the SOCi biased time based on one or a plurality of the elapsed time from the end of the previous system operation of the battery 400 or the end of charging or discharging during the previous system operation to the start of the current system activation, the battery temperature T, the degradation degree SOH, and the polarization voltage Vp2 after the start of the current system activation, and sets the weight W such that the weight of SOCi becomes large while the elapsed time from the start of the current system activation is within the SOCi biased time. As a result, since SOCw is calculated using SOCi, instead of SOCv for which calculation accuracy is likely to deteriorate, after the start of the system activation in which the influence of polarization of the battery 400 remains, it is possible to prevent the deterioration of the calculation accuracy of SOCw.

Second Embodiment

Figure 9:
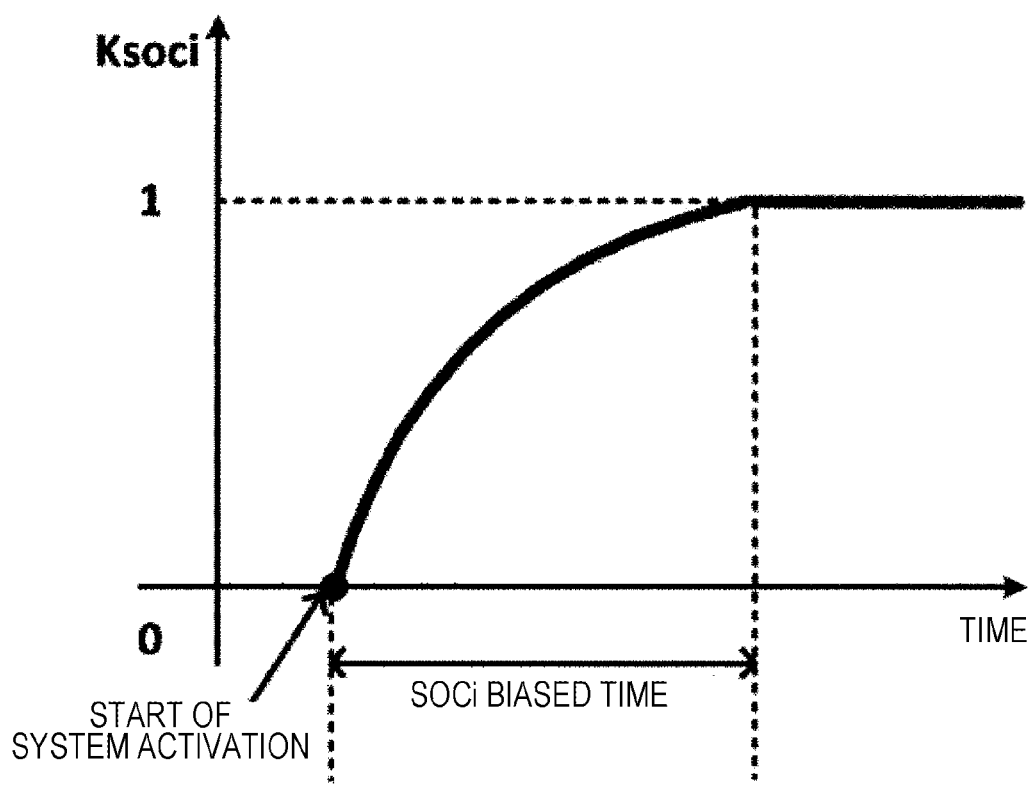
FIG. 9 is a diagram illustrating an example in which the correction coefficient Ksoci is set to increase as time elapses and to be one when an SOCi biased time has elapsed.

FIG. 9 illustrates an example in which a correction coefficient Ksoci of the SOCw calculation unit 114 of the battery state estimation device 110 according to a second embodiment is set to be changed depending on an elapsed time from a start of current system activation. A difference from the embodiment of the present invention illustrated in FIG. 8 is that the correction coefficient Ksoci is set to increases as time elapses and to be one when the SOCi biased time has elapsed. In this manner, the correction coefficient Ksoci approaches one with a lapse of time, so that the weight W also gradually approaches based on the conventional Formula 5. As a result, the weight of SOCi gradually decreases from a state where the large weight of SOCi is set, there is no risk of sudden change in calculation of SOCw, and a behavior of SOCw is stabilized.

A polarization voltage increases with a lapse of time when charging is started, and decreases with a lapse of time when charging is ended and eventually becomes a substantially zero state as described above. The polarization voltage Vp decreases with a lapse of time when discharging is started, and increases with a lapse of time when discharging is ended and eventually becomes a substantially zero state. That is, the influence of the polarization voltage Vp2 is large since an absolute value of the polarization voltage Vp2 is large at the start of the current system activation, but the influence of the polarization voltage Vp2 becomes small since the absolute value of the polarization voltage Vp2 decreases with a lapse of time Therefore, the weight W is calculated in accordance with the degree of the influence of polarization by increasing the weight of SOCi such that SOCw is calculated using SOCi instead of SOCv for which calculation accuracy is likely to deteriorate after the start of system activation in which the influence of polarization of the battery 400 remains, and then, gradually decreasing the weight of SOCi when the influence of polarization decreases with a lapse of time as in the present embodiment, so that it is possible to prevent the deterioration of calculation accuracy of SOCw due to the influence of polarization.

Third Embodiment

Figure 10:
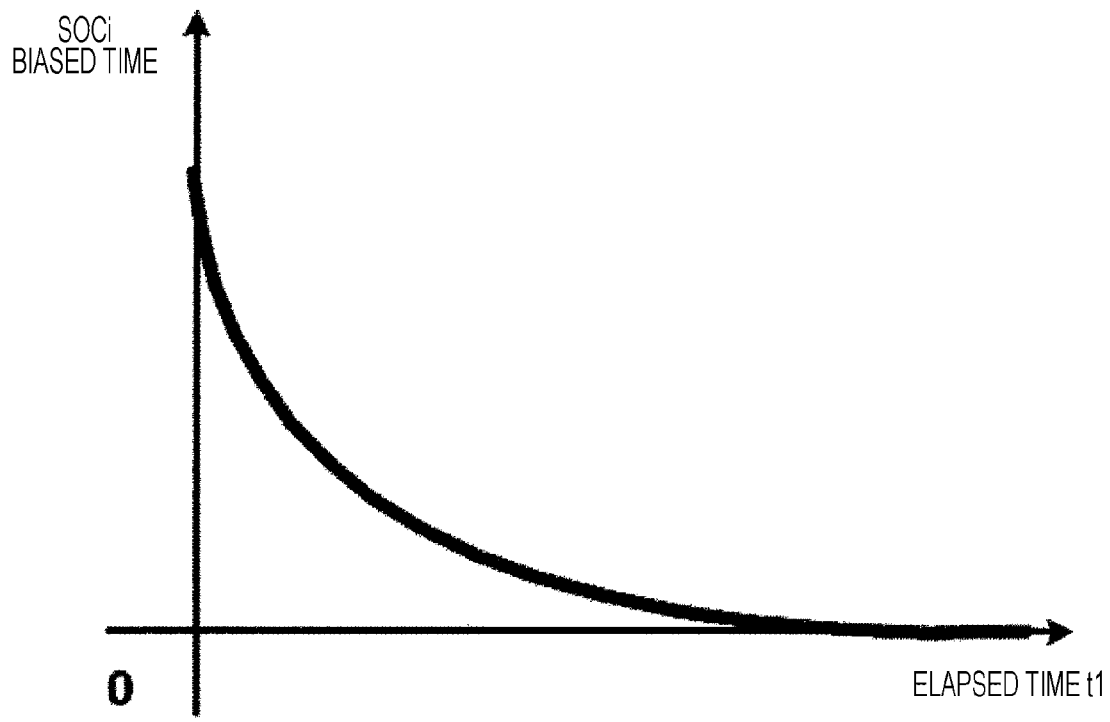
FIG. 10 is a diagram illustrating an example of a relationship between the SOCi biased time and an elapsed time t1.
Figure 11:
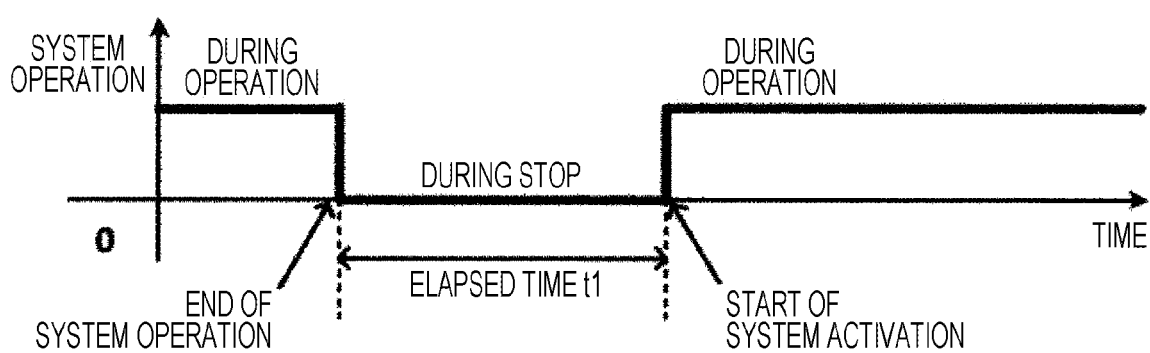
FIG. 11 is a diagram for describing the elapsed time t1.

FIG. 10 is an example illustrating a method of calculating an SOCi biased time that is calculated by the SOCi biased time calculation unit 115 of the battery state estimation device 110 according to a third embodiment. Here, the elapsed time t1 is an elapsed time from an end of a previous system operation to a start of current system activation as illustrated in FIG. 11. As illustrated in FIG. 10, the SOCi biased time is set to be longer as the elapsed time t1 is shorter.

When the battery 400 is used until the end of the previous system operation and is being charged or discharged, a polarization voltage is generated. Although the polarization voltage decreases with a lapse of time as described above, there is a possibility that the polarization voltage still has a high value when the elapsed time t1 from the end of the previous system operation to the start of the current system activation is short. In such a case, it is possible to prevent the deterioration of calculation accuracy of SOCw by increasing the SOCi biased time and increasing the weight of SOCi while an elapsed time from the start of the current system activation is within the SOCi biased time.

Figure 12:
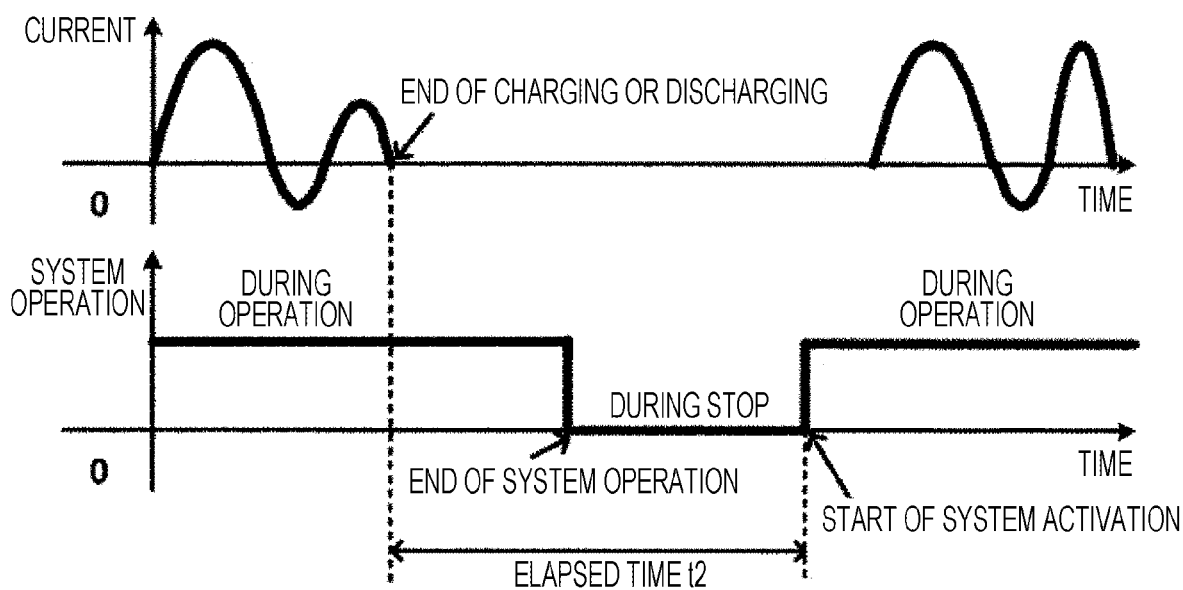
FIG. 12 is a diagram for describing an elapsed time t2.

In addition, it is also possible to use the elapsed time t2 from an end of charging or discharging during the previous system operation to a start of the current system activation considering the influence of the polarization voltage more directly as illustrated in FIG. 12. In this case, for example, the battery current I is detected and the elapsed time t2 from the end of charging or discharging is measured. An SOCi biased time is obtained using this elapsed time t2 in the same manner as in FIG. 11. As a result, it is possible to calculate the SOCi biased time in accordance with the influence of the polarization of the battery 400, and to prevent the deterioration of calculation accuracy of SOCw.

Fourth Embodiment

Figure 13:
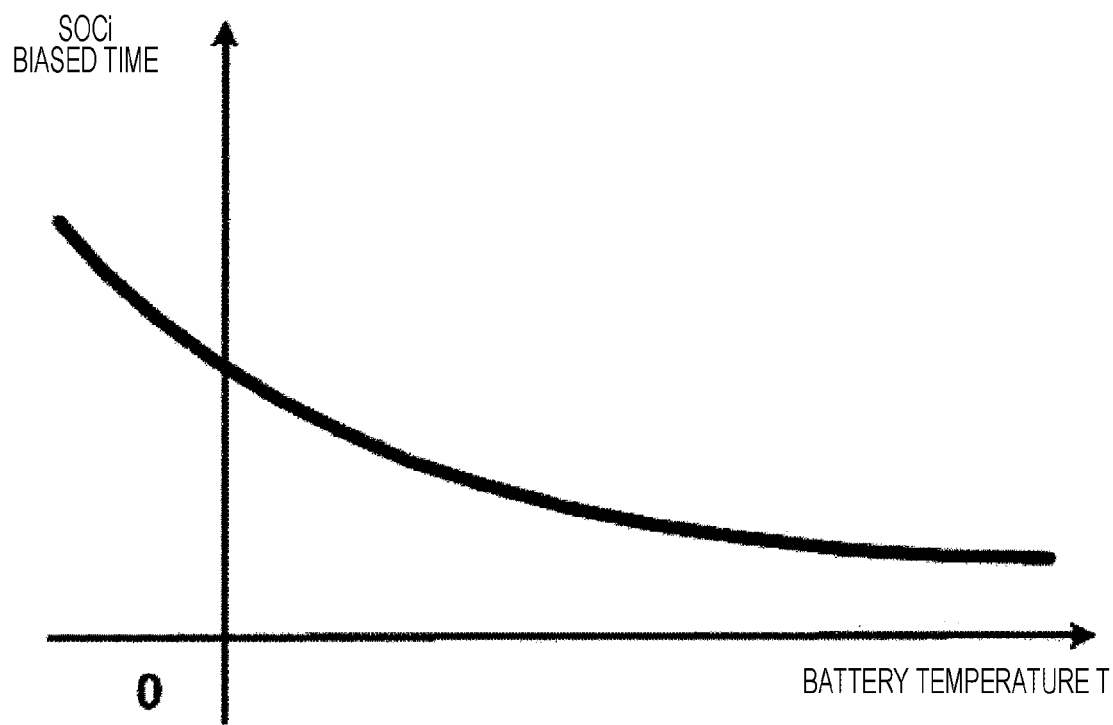
FIG. 13 is a view illustrating an example of a relationship between the SOCi biased time and the battery temperature T.

FIG. 13 is an example illustrating a method of calculating an SOCi biased time that is calculated by the SOCi biased time calculation unit 115 of the battery state estimation device 110 according to a fourth embodiment. In the drawing, the SOCi biased time is set to be longer as the battery temperature T is lower. As described above, the polarization voltage is characterized by varying depending on the battery temperature T of the battery 400. In general, as the battery temperature T is lower, the polarization voltage becomes higher, and a time elapsed until an absolute value of the polarization voltage becomes substantially zero also tends to be longer. In such a case, since the influence of the polarization increases as the battery temperature T is lower, it is possible to prevent the deterioration of calculation accuracy of SOCw by increasing the weight of SOCi while an elapsed time from the start of the current system activation is within the SOCi biased time by increasing the SOCi biased time.

Fifth Embodiment

Figure 14:
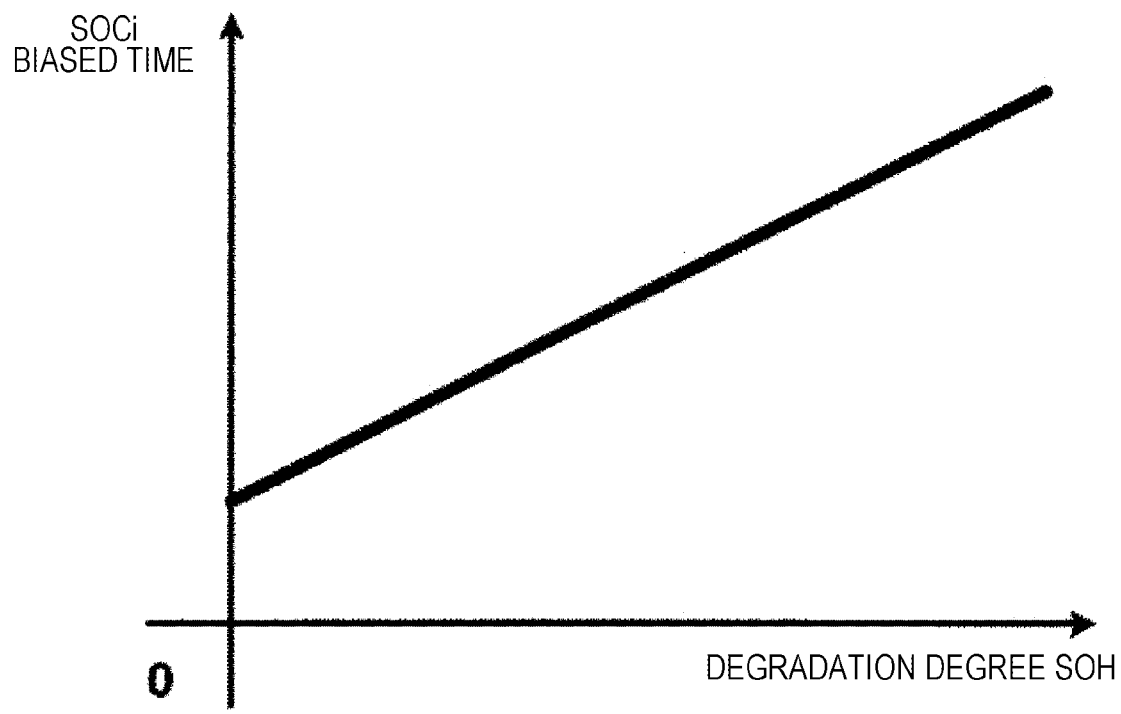
FIG. 14 is a diagram illustrating an example of a relationship between the SOCi biased time and a degradation degree SOH.

FIG. 14 is an example illustrating a method of calculating an SOCi biased time that is calculated by the SOCi biased time calculation unit 115 of the battery state estimation device 110 according to a fifth embodiment. In the drawing, the SOCi biased time is set to be longer as the degradation degree SOH of the battery is larger. A polarization voltage is characterized by varying depending on an internal resistance of the battery 400. In general, as the internal resistance is higher, the polarization voltage becomes higher, and a time elapsed until an absolute value of the polarization voltage becomes substantially zero also tends to be longer. The internal resistance becomes high when the degradation degree SOH of the battery is large, that is, the influence of polarization increases as the degradation degree SOH increases. Thus, it is possible to prevent the deterioration of calculation accuracy of SOCw by increasing the weight of SOCi while an elapsed time from the start of the current system activation is within the SOCi biased time by increasing the SOCi biased time.

Sixth Embodiment

Figure 15:
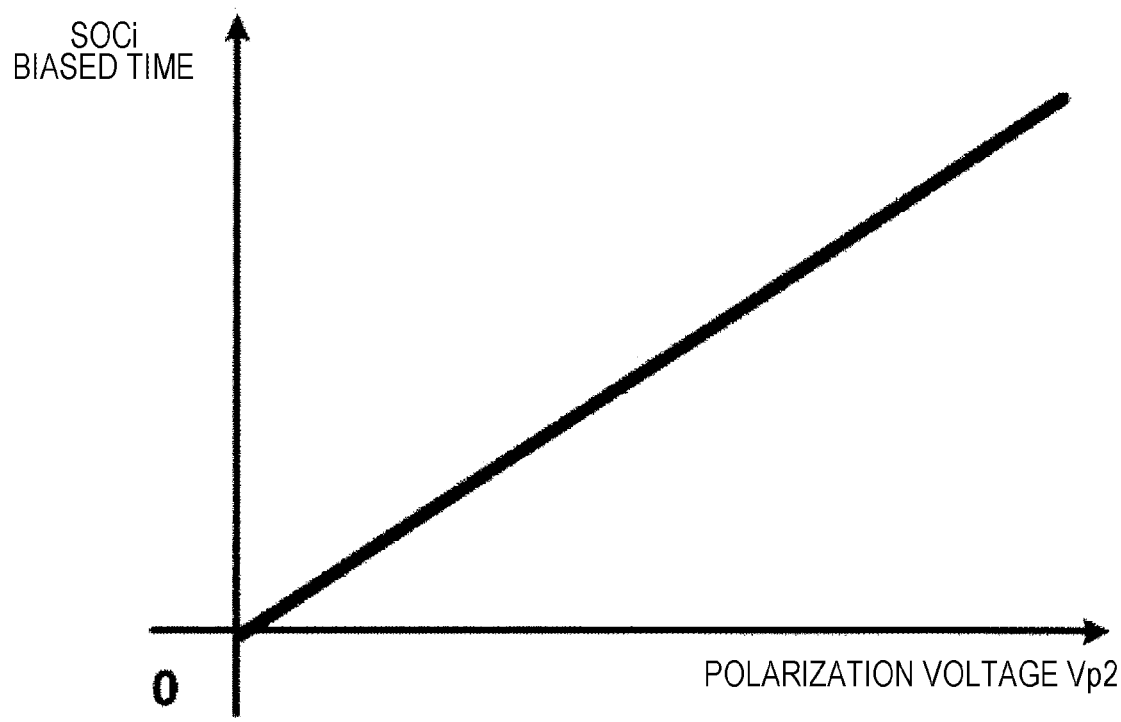
FIG. 15 is a diagram illustrating an example of a relationship between the SOCi biased time and a polarization voltage Vp2.

FIG. 15 is an example illustrating a method of calculating an SOCi biased time that is calculated by the SOCi biased time calculation unit 115 of the battery state estimation device 110 according to the present fifth embodiment. In the drawing, the SOCi biased time is set to be longer as the polarization voltage Vp2 of a battery is higher. Since the influence of polarization increases as the polarization voltage Vp2 is higher, it is possible to prevent the deterioration of calculation accuracy of SOCw increasing the weight of SOCi while an elapsed time from the start of the current system activation is within the SOCi biased time by increasing the SOCi biased time.

REFERENCE SIGNS LIST 100 battery control device
110 battery state estimation device
111 SOCv calculation unit
112 SOCi calculation unit
113 IR calculation unit
114 weight calculation unit
115 SOCi biased time calculation unit
120 storage unit
200 measurement unit
300 output unit
400 battery
1000 battery system

The invention claimed is:

1. A battery management device comprising: a memory; and a processor communicatively coupled to the memory, the processor is configured to: calculates a first state of charge using a voltage across both ends of a battery; calculates a second state of charge by integrating currents flowing in the battery; performs weighted addition of the calculated first state of charge of the battery-and the calculated second state of charge of the battery; and calculates an SOC biased time based on at least one elapsed time from at least one of an end of a previous system operation of the battery and an end of charging or discharging during the previous system operation to a start of current system activation, a temperature of the battery, a degree of degradation of the battery, and a polarization voltage of the battery, wherein the processor increases a weight of the calculated second state of charge of the battery while an elapsed time from the start of the current system activation is within the SOCi biased time, and wherein a correction coefficient is used by the processor to calculate the weight of the calculated second state of charge of the battery, and the correction coefficient is to a value of equal to or greater than 0 and less than 1 after the start of current system activation and the correction coefficient is increased to a second value of 1 after the calculated SOCi biased time elapses.

2. The battery management device according to claim 1, wherein
the processor gradually decreases the weight of the calculated second state of charge of the battery with a lapse of the elapsed time while the elapsed time from the start of the current system activation is within the SOCi biased time.

3. The battery management device according to claim 1, wherein
the processor sets the SOCi biased time to be longer as the elapsed time from the end of the previous system operation of the battery or the end of charging or discharging during the previous system operation to the start of the current system activation is shorter.

4. The battery management device according to claim 1, wherein
the processor sets the SOCi biased time to be longer as the temperature of the battery is lower.

5. The battery management device according to claim 1, wherein
the processor sets the SOCi biased time to be longer as the degree of degradation of the battery is larger.

6. The battery management device according to claim 1, wherein
the processor sets the SOCi biased time to be longer as the polarization voltage of the battery is higher.

7. The battery management device according to claim 1, wherein
the processor calculates the weight of the calculated second state of charge of the battery by using formula (1):

$$W = K_{soci} \times 1/(1+R \cdot |I|)$$

wherein w is the weight of the calculated state of charge of the battery, Ksoci is the correlation coefficient and R is an internal resistance of the battery.

* * * * *